United States Patent
Elsayed et al.

(10) Patent No.: US 10,742,191 B2
(45) Date of Patent: Aug. 11, 2020

(54) BULK MODE MICROELECTROMECHANICAL RESONATOR DEVICES AND METHODS

(71) Applicant: MEMS-VISION INTERNATIONAL INC., Montreal (CA)

(72) Inventors: Mohannad Elsayed, Verdun (CA); Mourad El-Gamal, Brossard (CA); Frederic Nabki, Montreal (CA); Paul-Vahe Cicek, Montreal (CA)

(73) Assignee: MEMS Vision International Inc., Montreal, Quebec (CA)

( * ) Notice: Subject to any disclaimer, the term of this patent is extended or adjusted under 35 U.S.C. 154(b) by 426 days.

(21) Appl. No.: 15/872,265

(22) Filed: Jan. 16, 2018

(65) Prior Publication Data

US 2018/0219529 A1 Aug. 2, 2018

Related U.S. Application Data

(60) Provisional application No. 62/453,630, filed on Feb. 2, 2017.

(51) Int. Cl.
*H03H 9/15* (2006.01)
*H03H 9/205* (2006.01)
(Continued)

(52) U.S. Cl.
CPC ........... *H03H 9/205* (2013.01); *B81B 3/0086* (2013.01); *H03H 3/0072* (2013.01);
(Continued)

(58) Field of Classification Search
CPC .... H03H 3/0072; H03H 3/0075; H03H 9/205; H03H 9/171; H03H 9/2436;
(Continued)

(56) References Cited

U.S. PATENT DOCUMENTS

| | | | | |
|---|---|---|---|---|
| 7,586,239 B1* | 9/2009 | Li | ........................ | H03H 3/0072 310/323.02 |
| 7,681,433 B2* | 3/2010 | Konno | ................. | G01N 29/036 73/24.06 |
| 2002/0105393 A1* | 8/2002 | Clark | ..................... | H03H 9/505 333/197 |
| 2006/0273867 A1* | 12/2006 | Piazza | .................... | H03H 9/132 333/189 |
| 2007/0220971 A1* | 9/2007 | Ayazi | ................. | G01C 19/5698 73/504.02 |
| 2011/0067984 A1* | 3/2011 | Nguyen | .................. | H01P 1/127 200/181 |

(Continued)

*Primary Examiner* — Emily P Pham
(74) *Attorney, Agent, or Firm* — Rosenberg, Klein & Lee

(57) ABSTRACT

Micromachined microelectromechanical systems (MEMS) based resonators offer integration with other MEMS devices and electronics. Whilst piezoelectric film bulk acoustic resonators (FBAR) generally exhibit high electromechanical transduction efficiencies and low signal transmission losses they also suffer from low quality factors and limited resonance frequencies. In contrast electrostatic FBARs can yield high quality factors and resonance frequencies but suffer from increased fabrication complexity. lower electromechanical transduction efficiency and significant signal transmission loss. Accordingly, it would be beneficial to overcome these limitations by reducing fabrication complexity via a single metal electrode layer topping the resonator structure and supporting relatively low complexity/low resolution commercial MEMS fabrication processes by removing the fabrication requirement for narrow transduction gaps. Beneficially, embodiments of the invention provide MEMS circuits with electrostatic tuning and provide resonator designs combining the advantages of piezoelectric actuation and bulk-mode resonators.

9 Claims, 11 Drawing Sheets

(51) Int. Cl.
*B81B 3/00* (2006.01)
*H03H 9/17* (2006.01)
*H03H 9/24* (2006.01)
*H03H 3/007* (2006.01)

(52) U.S. Cl.
CPC .......... *H03H 3/0075* (2013.01); *H03H 9/171* (2013.01); *H03H 9/2436* (2013.01); *B81B 2201/0271* (2013.01); *B81B 2207/07* (2013.01); *H03H 2009/155* (2013.01); *H03H 2009/241* (2013.01)

(58) Field of Classification Search
CPC ........ H03H 2009/241; H03H 2009/155; B81B 3/0086; B81B 2201/0271; B81B 2207/07
See application file for complete search history.

(56) References Cited

U.S. PATENT DOCUMENTS

| | | | |
|---|---|---|---|
| 2013/0083044 A1* | 4/2013 | Zuo | H03H 9/02228 345/520 |
| 2014/0111288 A1* | 4/2014 | Nikkel | H03H 9/02118 333/187 |
| 2016/0006414 A1* | 1/2016 | Chodavarapu | G01L 9/0042 310/309 |
| 2017/0126206 A1* | 5/2017 | Nguyen | H03H 9/525 |
| 2018/0183403 A1* | 6/2018 | Kaajakari | H03H 9/205 |
| 2018/0209816 A1* | 7/2018 | Hodjat-Shamami | G01C 19/5684 |
| 2018/0321037 A1* | 11/2018 | Wen | H03H 9/132 333/189 |

* cited by examiner

S   Input/Output Signal Ports
DC  Tuning Voltage Port

Figure 9B
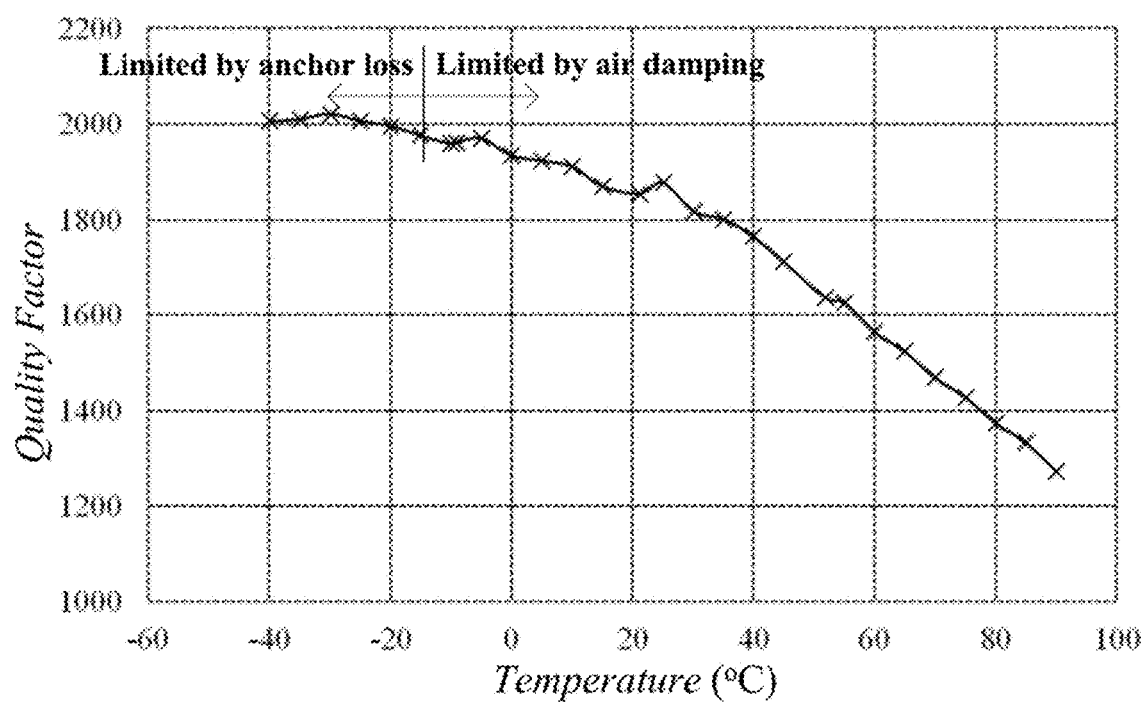
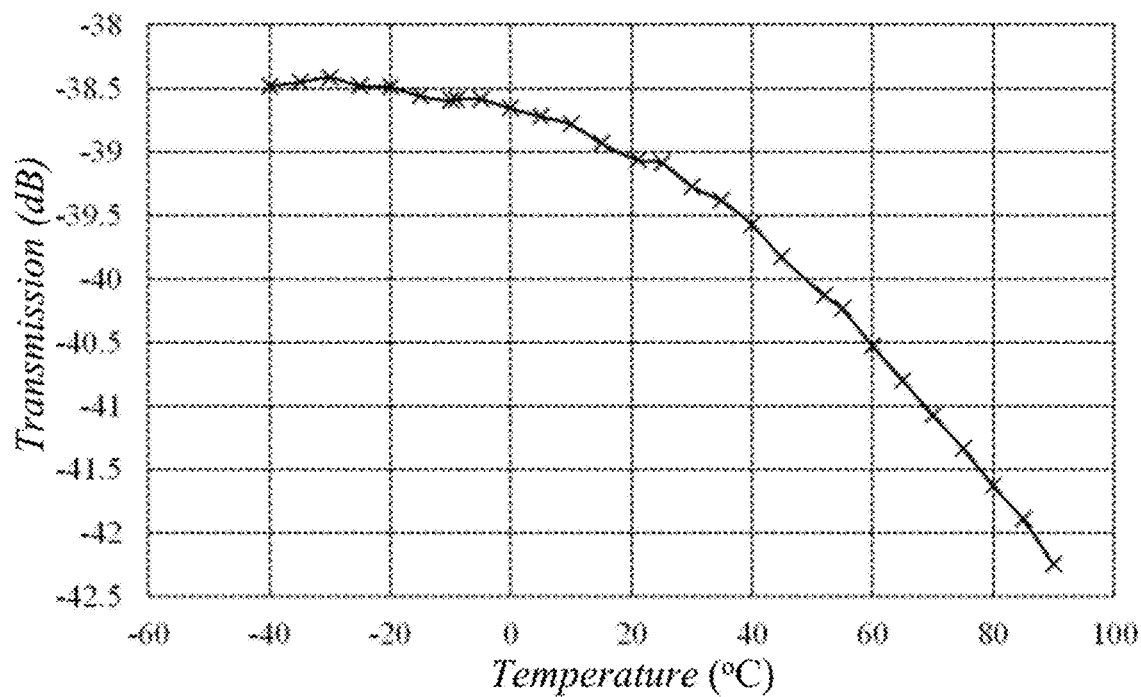
Figure 9C

BULK MODE MICROELECTROMECHANICAL RESONATOR DEVICES AND METHODS

CROSS-REFERENCE TO RELATED APPLICATIONS

This patent application claims the benefit of U.S. Provisional Patent Application 62/453,630 filed on Feb. 2, 2017 entitled "Bulk Mode Microelectromechanical Resonator Devices and Methods", the entire contents of which are incorporated herein by reference.

FIELD OF THE INVENTION

This invention relates to MEMS based bulk disk resonators and more particularly to wine-glass bulk mode disk resonators exploiting novel transverse piezoelectric actuation.

BACKGROUND OF THE INVENTION

Micromachined microelectromechanical systems (MEMS) based resonators are receiving continuously increasing attention due to their small sizes compared to conventional crystal-based resonators as well as their potential for integration with other MEMS resonators and circuits on the same chip which can be especially advantageous for handheld electronic device applications (e.g. smartphones and tablets) where weight, size, and cost are particularly critical parameters.

Micromachined resonators can be operated through two main widespread actuation mechanisms: piezoelectric or electrostatic, each method having its specific advantages and drawbacks. Piezoelectric devices such as surface acoustic wave (SAW) and film bulk acoustic resonators (FBAR) are already widely used in timing applications. Piezoelectric FBARs generally exhibit high electromechanical transduction efficiencies and low signal transmission losses, resulting in low motional resistances, which is very advantageous as it simplifies the design constraints of the associated electronic circuitry and results in lower power consumption. Further, piezoelectric devices do not require any DC voltage for operation.

However, conventional piezoelectric FBAR devices generally suffer from lower quality factors, notably limited by the resonator-to-electrode strain loss at the interface and their resonance frequencies are limited by the piezoelectric layer thickness, as they utilize out-of-plane vibration modes. This limitation makes it impractical to achieve more than one resonant frequency on the same chip. Lateral mode devices in contrast use in-plane modes, and can achieve different resonant frequencies by adjusting the device dimensions. Rinaldi et al. in "High Frequency AlN MEMS Resonators with Integrated Nano Hot Plate for Temperature Controlled Operation" (IEEE Proc. Int. Freq. Control Symp., pp. 1-5, 2012) employed integrated nanoscale heating elements for temperature control of aluminum nitride MEMS contour mode resonators. The heating elements are separated from the resonators structures by sub-micron air gaps in order to maintain the electromechanical properties of the devices.

In contrast, Hummel et al. in "Highly Reconfigurable Aluminum Nitride MEMS Resonator using 12 Monolithically Integrated Phase Change Material Switches" (IEEE Proc. Int. Conf. Solid State Sens. Actuators, Microsyst., pp. 323-326, 2015), integrated switches serve to create a reconfigurable contour mode resonator. In contrast, Gong et al. in "Design and Analysis of Lithium Niobate Based High Electromechanical Coupling RF-MEMS Resonators for Wideband Faltering" (IEEE Trans. Micro. Theory Techn., Vol. 61, No. 1, pp. 403-414, 2013), exploit another type of lateral vibrating piezoelectric resonator is presented based on lithium niobate. It is also important to note that piezoelectric actuation does not provide inherent means for frequency tuning.

In contrast electrostatic resonators, which rely mostly on vibratory resonance, operate either in a flexural or bulk mode. Bulk-mode devices typically exhibit high stiffness, and are consequently less prone to thermoelastic damping, compared to flexural devices, allowing them to achieve large quality factors (>10,000), even at atmospheric pressure. However, electrostatic actuation causes these resonators to exhibit lower electromechanical transduction efficiency and significant signal transmission loss, leading to higher motional resistance than typical piezoelectric devices. This can however be mitigated by increasing the applied DC polarization voltage and utilizing sophisticated technologies to realize very thin lateral transduction gaps (<100 nm). Electrostatic resonators can also benefit from the electrostatic spring softening phenomenon to allow for tuning the resonance frequency by varying the polarization voltage. This effect cannot be replicated for typical piezoelectric devices. Within the prior art capacitive bulk-mode disk resonators exhibiting quality factors of 2,000-150,000 and motional resistances of 1.5 kΩ-1MΩ using polarization voltages<20 V have been demonstrated. Further, within the prior art, see for example Hung et al. in "Capacitive-Piezoelectric AlN Resonators with Q>12,000" (IEEE Proc. Int. Conf. Micro Electro Mech. Syst., pp. 173-176, 2011), actuation and sensing of a bulk-mode disk resonator fabricated from aluminum nitride (AlN) has been reported exploiting a combination of piezoelectric and capacitive methods. The reported device resonates at 51 MHz with quality factor of approximately 13,000 and a loss of approximately −34 dB. However, no tuning capability is reported. In contrast, Schneider et al. in "On/off Switchable High-Q Capacitive-Piezoelectric AlN Resonators" (IEEE Proc. Int. Conf. Micro Electro Mech. Syst., pp. 1265-1268, 2014), a radial mode AlN resonator is presented which employs a capacitive-piezoelectric actuation scheme similar to Hung, using metal electrodes above and beneath the disk structure. The electrostatic electrodes beneath the disk structure are also used to pull it down to the substrate and consequently power the resonator off upon the application of a switching DC voltage.

Notably, all the aforementioned prior art bulk-mode designs require complex fabrication process steps to realize submicron gaps in order to avoid excessive motional resistances. In Serrano et al. "Electrostatically Tunable Piezoelectric-on-Silicon Micromechanical Resonator for Real-Time Clock" (IEEE Trans. Ultrason., Ferroelectr., Freq. Control, vol. 59, no. 3, pp. 358-365, 2012) a flexural (out-of-plane) piezoelectric resonator is presented. The device employs a metal electrode beneath the suspended structure for electrostatic tuning. However, it operates at a relatively low frequency of approximately 32 kHz due to the low stiffness flexural mode of operation. In Hodjat-Shamami et al. in "A Dynamically Mode-Matched Piezoelectrically Transduced High Frequency Flexural Disk Gyroscope" (IEEE Proc. Int. Conf. Micro Electro Mech. Syst. (MEMS), 2015, pp. 789-792) a different method of frequency tuning is presented, where electromechanical feedback of the drive-mode displacement signal is used in order to achieve dynamic mode-matching of the proposed piezoelectric gyroscope. Electrostatic resonating bulk structures using commercial micromachining technologies have been fabricated within the prior art but the devices had to operate at high voltages (>50 V) in order to overcome the dimension limitations on the transducer gap imposed by the technology.

Within the prior art of Elsayed et al. in "A Combined Comb/Bulk Mode Gyroscope Structure for Enhanced Sensitivity" (IEEE Proc. Int. Conf. Micro Electro Mech. Syst. (MEMS), 2013, pp. 649-652) and "A Novel Comb Architecture for Enhancing the Sensitivity of Bulk Mode Gyroscopes" (Sensors, vol. 13, pp. 16641-16656, 2013) combs were added to the bulk-resonating structure in order to improve overall sensitivity and allow for operation at lower voltage, at the expense of increased area.

Accordingly, it would be beneficial to provide MEMS based bulk mode resonators that overcome the aforementioned limitations of prior art designs. It would be beneficial to provide MEMS designers with bulk mode resonator designs that combine transverse piezoelectric actuation with bulk mode resonance in order to achieve low motional resistance without requiring any DC voltage, reasonable quality factor (even in air), and a relatively high resonance frequency. It would be further beneficial to provide MEMS circuit designers with a bulk mode resonator design that reduces fabrication complexity by employing a single metal electrode layer topping the resonator structure rather than conventional FBAR designs within the prior art that require additional metal electrodes beneath the structure. Beneficially, such designs also lower the Q-limiting resonator-to-electrode strain loss compared to these conventional FBAR designs.

It would be further of benefit to MEMS circuit designer to provide such MEMS bulk mode resonators without requiring narrow transduction gaps allowing their fabrication on relatively low complexity and low resolution commercial MEMS processes such as the MEMSCAP PiezoMUMPs process, for example. Further, beneficially embodiments of the invention provide MEMS circuits with electrostatic tuning and provide for designs that combine the advantages of piezoelectric actuation and bulk-mode resonators.

Other aspects and features of the present invention will become apparent to those ordinarily skilled in the art upon review of the following description of specific embodiments of the invention in conjunction with the accompanying figures.

SUMMARY OF THE INVENTION

It is an object of the present invention to mitigate limitations in the prior art relating to MEMS based bulk disk resonators and more particularly to wine-glass bulk mode disk resonators exploiting novel transverse piezoelectric actuation.

In accordance with an embodiment of the invention there is provided a microelectromechanical systems (MEMS) resonator comprising:
a central disk capable of vibrating in a "wine-glass" mode;
a layer formed across predetermined regions of the central disk formed from a piezoelectric material;
a metallization layer formed upon the layer; and
a plurality of N supports, each support coupled between the central disk and layer at one end and a substrate upon which the MEMS resonator is disposed; wherein
the resonator exhibits bulk mode resonance with transverse piezoelectric actuation of the layer.

In accordance with an embodiment of the invention there is provided a resonator array comprising:
a substrate;
a plurality of microelectromechanical systems (MEMS) resonators formed upon the substrate;
wherein each MEMS resonator comprises:
a central disk capable of vibrating in a "wine-glass" mode;
a layer formed across predetermined regions of the central disk formed from a piezoelectric material;
a metallization layer formed upon the layer; and
a plurality of N supports, each support coupled between the central disk and layer at one end and a substrate upon which the MEMS resonator is disposed; wherein
the resonator exhibits bulk mode resonance with transverse piezoelectric actuation of the layer; and
each resonator exhibits its bulk mode resonance at a different predetermined resonant frequency.

In accordance with an embodiment of the invention there is provided a resonator comprising a piezoelectric layer disposed across a predetermined portion of a free standing and supported central disk having a plurality of upper electrodes and a plurality of lower electrodes either side established in dependence upon a strain structure of the free standing and supported central disk, wherein a first subset of the upper electrodes are coupled to drive signal electrodes and a second subset of the plurality of upper electrodes are coupled to read signal electrodes.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIGS. 9A to 9C respectively depict the temperature dependence of disk resonators according to embodiments of the invention for resonance frequency, quality factor, and transmission respectively.

DETAILED DESCRIPTION

Figure 1:
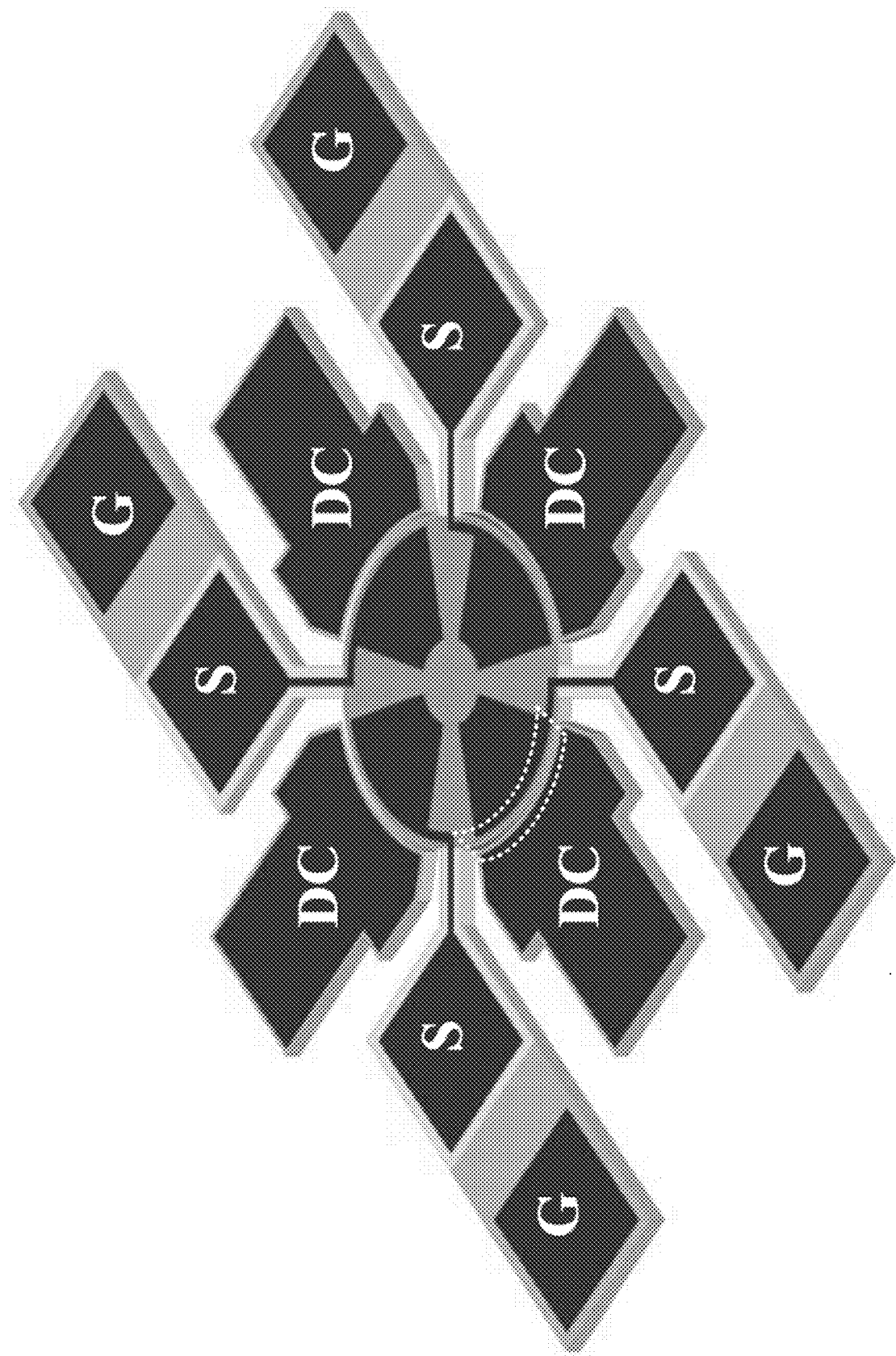
FIG. 1 depicts a simplified diagram of a disk resonator according to an embodiment of the invention and outlining the signal pads used for piezoelectric actuation (S), ground pads (G) and electrostatic tuning pads (DC)

The present invention is directed to MEMS based bulk disk resonators and more particularly to wine-glass bulk mode disk resonators exploiting novel transverse piezoelectric actuation.

The ensuing description provides representative embodiment(s) only, and is not intended to limit the scope, applicability or configuration of the disclosure. Rather, the ensuing description of the embodiment(s) will provide those skilled in the art with an enabling description for implementing an embodiment or embodiments of the invention. It being understood that various changes can be made in the function and arrangement of elements without departing from the spirit and scope as set forth in the appended claims. Accordingly, an embodiment is an example or implementation of the inventions and not the sole implementation. Various appearances of "one embodiment," "an embodiment" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention can also be implemented in a single embodiment or any combination of embodiments.

Reference in the specification to "one embodiment", "an embodiment", "some embodiments" or "other embodiments" means that a particular feature, structure, or characteristic described in connection with the embodiments is included in at least one embodiment, but not necessarily all embodiments, of the inventions. The phraseology and terminology employed herein is not to be construed as limiting but is for descriptive purpose only. It is to be understood that where the claims or specification refer to "a" or "an" element, such reference is not to be construed as there being only one of that element. It is to be understood that where the specification states that a component feature, structure, or characteristic "may", "might", "can" or "could" be included, that particular component, feature, structure, or characteristic is not required to be included.

Reference to terms such as "left", "right", "top", "bottom", "front" and "back" are intended for use in respect to the orientation of the particular feature, structure, or element within the figures depicting embodiments of the invention. It would be evident that such directional terminology with respect to the actual use of a device has no specific meaning as the device can be employed in a multiplicity of orientations by the user or users. Reference to terms "including", "comprising", "consisting" and grammatical variants thereof do not preclude the addition of one or more components, features, steps, integers or groups thereof and that the terms are not to be construed as specifying components, features, steps or integers. Likewise, the phrase "consisting essentially of", and grammatical variants thereof, when used herein is not to be construed as excluding additional components, steps, features, integers, or groups thereof but rather that the additional features, integers, steps, components, or groups thereof do not materially alter the basic and novel characteristics of the claimed composition, device, or method. If the specification or claims refer to "an additional" element, that does not preclude there being more than one of the additional element.

A: Design

Figure 2B:
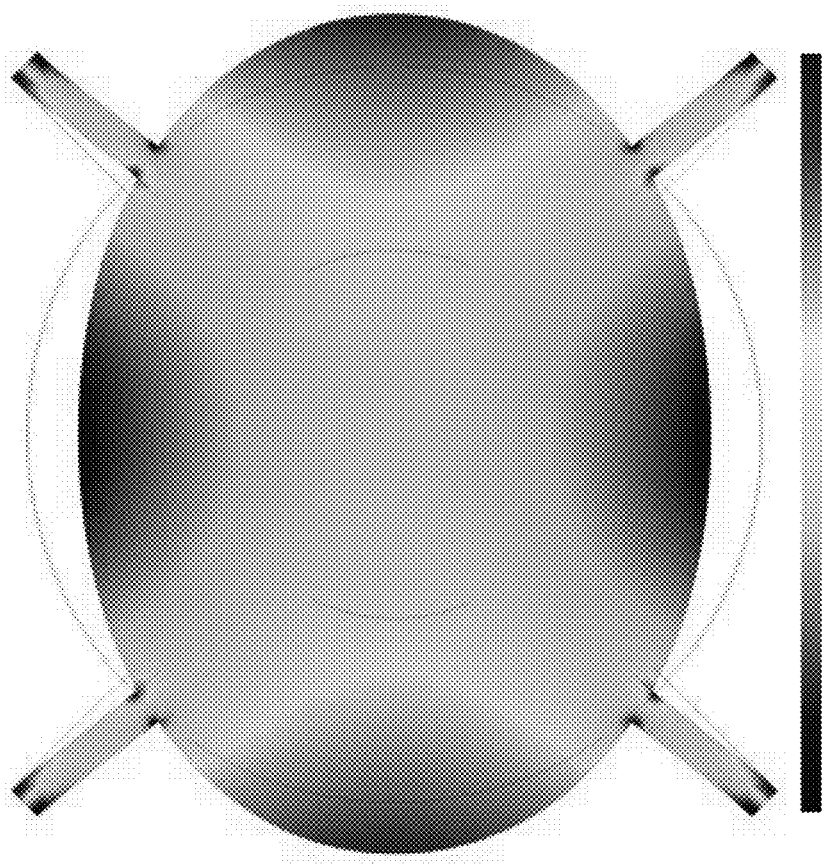
FIGS. 2A and 2B depict the wine-glass mode shape of a disk resonator according to an embodiment of the invention and its strain distribution respectively.

Referring to FIG. 1 there is depicted a simplified schematic of the proposed bulk disk resonator design according to an embodiment of the invention. The resonator device is composed of a single-crystalline silicon central disk structure acting as a wine-glass resonator. This disk is 10 μm thick and has a 200 μm diameter and is covered by a 0.5 μm layer of aluminum nitride, the piezoelectric material used for transduction and to bring the resonator into its wine-glass mode of resonance. The aluminum nitride covers the disk completely within some embodiments of the invention and within others it is patterned, for example into four distinct quadrants. Disks with full aluminum nitride covering and that with four quadrants exhibit similar performance. The disk structure is supported by four suspension beams having a 10 μm width (the minimum allowed by the design rules of the commercial MEMS fabrication platform/technology employed by the inventors, e.g. MEMSCAP PiezoPUMPs) with 90° angular spacing, so as to correspond with the nodal points of the wine-glass resonance mode. The support beams are anchored to the substrate at their ends and mechanically connected to the electrical pads. Each of these supports is associated with a pair of pads, one for the signal routed above the piezoelectric layer, and the other for the ground, routed through the underlying silicon structural layer. For this purpose, an aluminum layer above the disk structure is patterned into four distinct quadrants, in order to match the strain distribution as depicted in FIG. 2B.

Figure 2A:
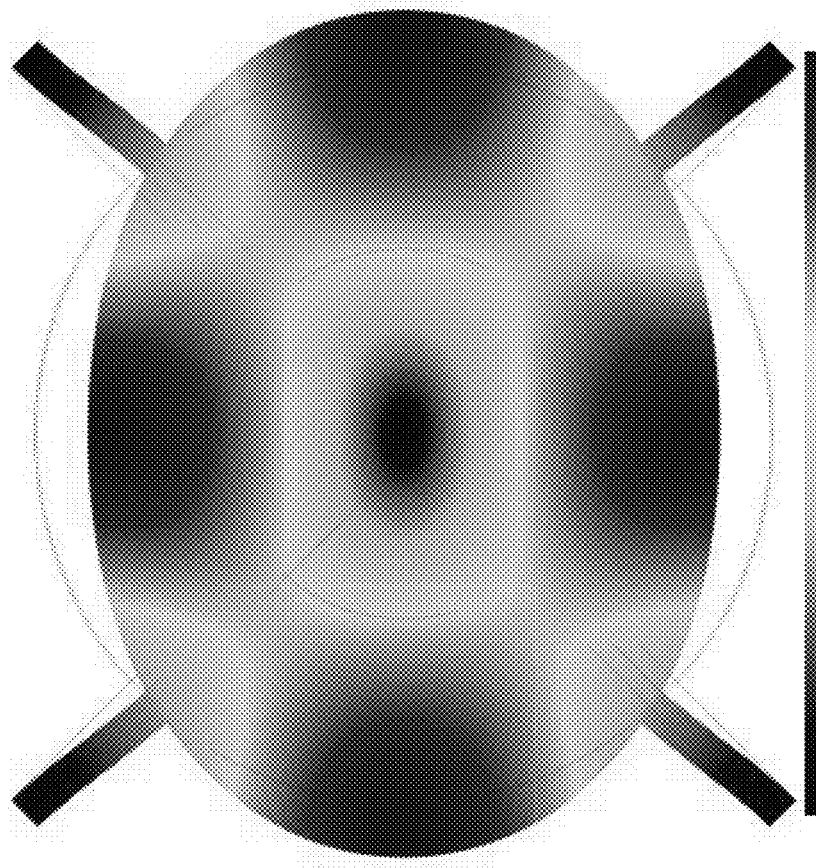

Each electrode is electrically connected to a distinct signal pad by an aluminum track routed above its respective suspension beam. The conductive structural silicon layer itself acts as the ground plane of the device, and connects with each ground pad while remaining electrically insulated from the signal track by a layer of silicon dioxide. Aluminum nitride is not present on the supports to avoid any unintended transduction which would alter the resonance mode and possibly lead to undesirable spurious modes of vibration. The disk structure is also surrounded by four capacitive electrodes which are separated from it by a lateral transduction gap of 2.5 μm (the minimum critical spacing allowed by the design rules of the commercial MEMS fabrication platform/technology employed by the inventors, e.g. MEMSCAP PiezoPUMPs). These electrodes are intended for electrostatic tuning of the resonance frequency through the electrostatic spring softening effect, as discussed subsequently in section C. Table I summarizes the design parameters of exemplary resonator device fabricated according to embodiments of the invention. Finite-element simulations illustrating the mode-shape and the strain distribution of the resonator in the wine-glass mode are shown in FIGS. 2A and 2B respectively. The resonance frequency of the disk in wine-glass mode is simulated to be of 17.54 MHz.

TABLE 1

Summary of Resonator Device Design Parameters

| Parameter | Value |
|---|---|
| Disk diameter (μm) | 200 |
| Structure thickness (μm) | 10 |
| Support width (μm) | 10 |

TABLE 1-continued

Summary of Resonator Device Design Parameters

| Parameter | Value |
|---|---|
| Capacitive gap (µm) | 2.5 |
| AlN layer thickness (µm) | 0.5 |
| Simulated resonance frequency (MHz) | ~17 |

B: Piezoelectric Actuation

Operation of the proposed device relies on the piezoelectric effect, a relationship across the electrical and mechanical domains. For certain materials with the proper atomic structure and crystal orientation, a mechanical stress results from electric charge accumulating across the material. This effect can also be used in reverse where a charge results from a mechanical stress. This relationship can be quantified, with the electric field and stress expressed as independent variables, by Senturia in "Microsystem Design" (Springer, 2001, p. 134), as given by Equations (1) and (2) where D is the electric displacement vector, ε is the dielectric constant matrix, E is the electric field intensity vector, d is the piezoelectric coefficient matrix, σ is the stress tensor, ξ is the strain tensor, and S is the compliance matrix.

$$D = \varepsilon E + d\sigma \quad (1)$$

$$\xi = d^T E + S\sigma \quad (2)$$

$$|\sigma_{IN\text{-}PLANE}| = \left|\frac{\varepsilon_{33} v_{IN}}{d_{31} t}\right| \quad (3)$$

For bulk mode disk resonators according to embodiments of the invention the vertical electric field resulting from the input voltage between the input electrodes on top of the disk and the ground plane is converted to an in-plane mechanical stress in the aluminum nitride layer through its transverse piezoelectric coefficient, $d_{31}$, as given by Equation (3) where $v_{IN}$ is the input voltage, $\varepsilon_{33}$ is the vertical dielectric constant of the piezoelectric layer (for example AlN), and t is the piezoelectric layer thickness, i.e. the distance between the signal electrodes and the ground plane. The quadrant subdivision of the electrodes was selected for the induced stress pattern to force a mechanical actuation of the disk in the wine-glass mode shape. Based on its structural and dimensional properties, the disk filters this mechanical perturbation to favor strain at frequencies close to its resonance, in an identical fashion to usual electrostatically-actuated disk resonators. The reverse piezoelectric effect serves to convert this piezoelectrically-induced and mechanically-filtered strain back into an electrical output voltage, see for example Su et al. "Thin Film Bulk Acoustic Resonators and Filters using ZnO and Lead Zirconium-Titanate Thin Films" (IEEE Trans. Micro. Theory Techn., vol. 49, no. 4, pp. 769-778, 2001).

C. Electrostatic Tuning

Generally, any resonator can be modeled as a spring-mass damper system wherein its resonance frequency can be expressed by Equation (4) where $k_{EQ}$ and $m_{EQ}$ are the equivalent spring constant and mass of the structure respectively. Based on a parallel-plate approximation, the capacitance between the electrodes and disk can be calculated using Equation (5) where $\varepsilon_0$ is the free space permittivity, A is the overlap area between the electrostatic electrodes and the disk, g is the gap between the electrodes, and x is the lumped displacement of the disk.

$$f_0 = \frac{1}{2\pi}\sqrt{\frac{k_{EQ.}}{m_{EQ.}}} \quad (4)$$

$$C \approx \frac{\varepsilon_0 A}{g + x} \quad (5)$$

$$F_{ELEC} = \frac{1}{2}\frac{dC}{dx}V^2 \quad (6)$$

$$k_{ELEC.} = -\frac{dF_{ELEC.}}{dx} \approx \frac{\varepsilon_0 A}{g^3} V_{TUNING}^2, \quad x \ll g \quad (7)$$

When a DC voltage, $V_{TUNING}$, is applied between the tuning electrodes and the grounded disk, an electrostatic force ($F_{ELEC.}$) is generated as given by Equation (6), see for example Senturia. This force impedes the motion of the resonator and therefore is equivalent to reducing the equivalent spring constant of the structure by a certain value, $k_{ELEC.}$, expressed as Equation (7), see for example Acar et al. in "Electrical Design of MEMS Gyroscopes" (MEMS Vibratory Gyroscopes. Springer, 2009, pp. 1-29). This spring softening effect alters the resonance frequency of the structure from its original value to that given by Equations (8A) and (8B).

$$f_r = \frac{1}{2\pi}\sqrt{\frac{k_{EQ.} - k_{ELEC.}}{m_{EQ.}}} = f_0\sqrt{1 - \frac{k_{ELEC.}}{k_{EQ.}}} \quad (8A)$$

$$f_r = f_0\sqrt{1 - \frac{\varepsilon_0 A}{k_{EQ.} g^3}V_{TUNING}^2} \quad (8B)$$

Such tuning is typically limited to capacitive-based resonators, as the piezoelectric devices do not readily allow for a similar softening effect. In this work however, the design presented makes use of this electrostatic tuning method, in order to allow for frequency tuning of the resonance induced via piezoelectric actuation.

D. Fabrication Process

The resonators described and depicted within the following sections of experimental results and analysis in this work were fabricated using the MEMSCAP PiezoMUMPs process. However, it would be evident that other manufacturing processes and technologies may be employed provided they either achieve the tolerances and linewidths of the designs implemented herein or variants of the design according to embodiments of the invention.

Figure 3A:
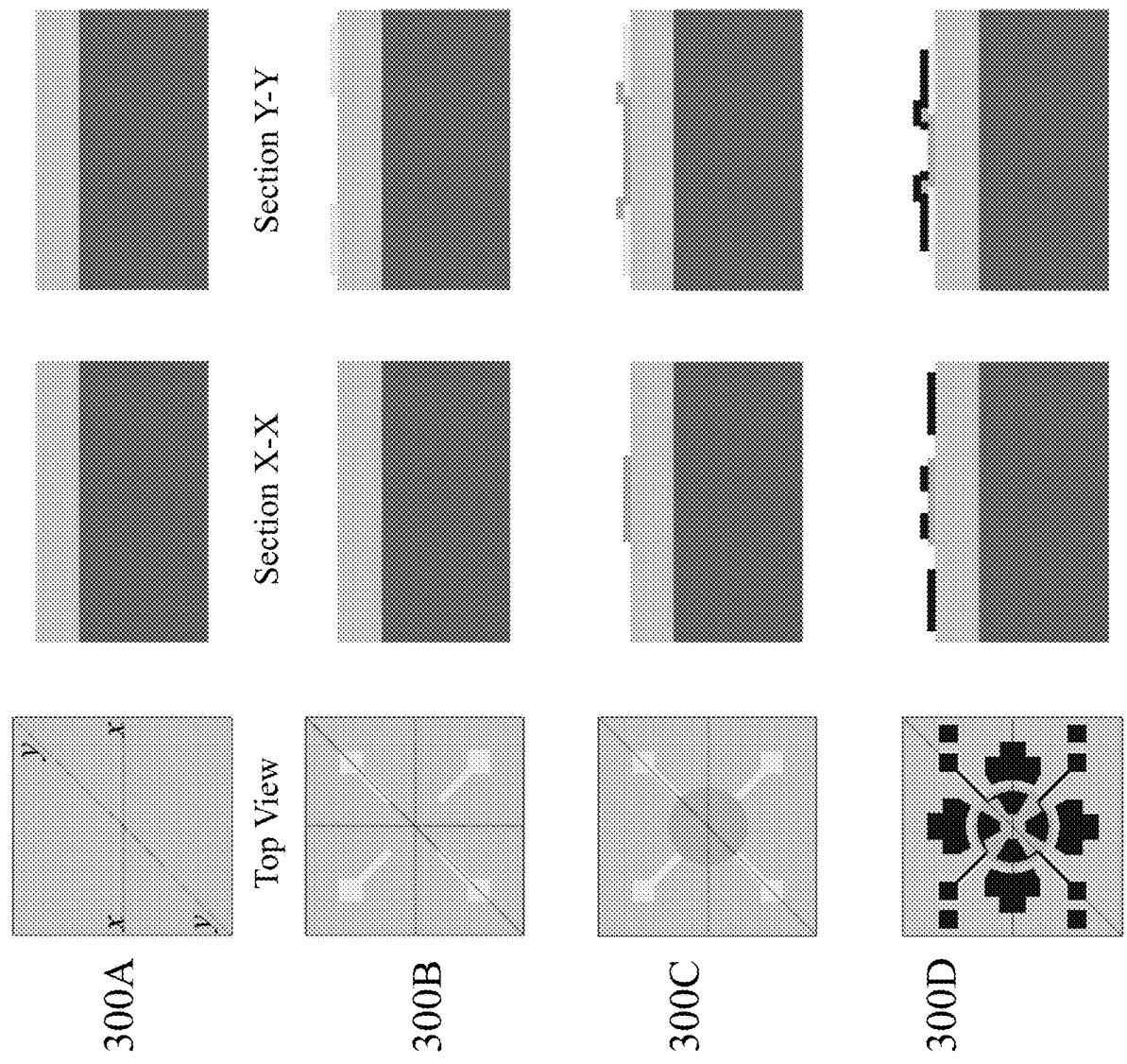
FIGS. 3A and 3B depict schematically a simplified manufacturing processing sequence based upon the MEMSCAP PiezoMUMPs process for a disk resonator according to an embodiment of the invention.
Figure 3B:
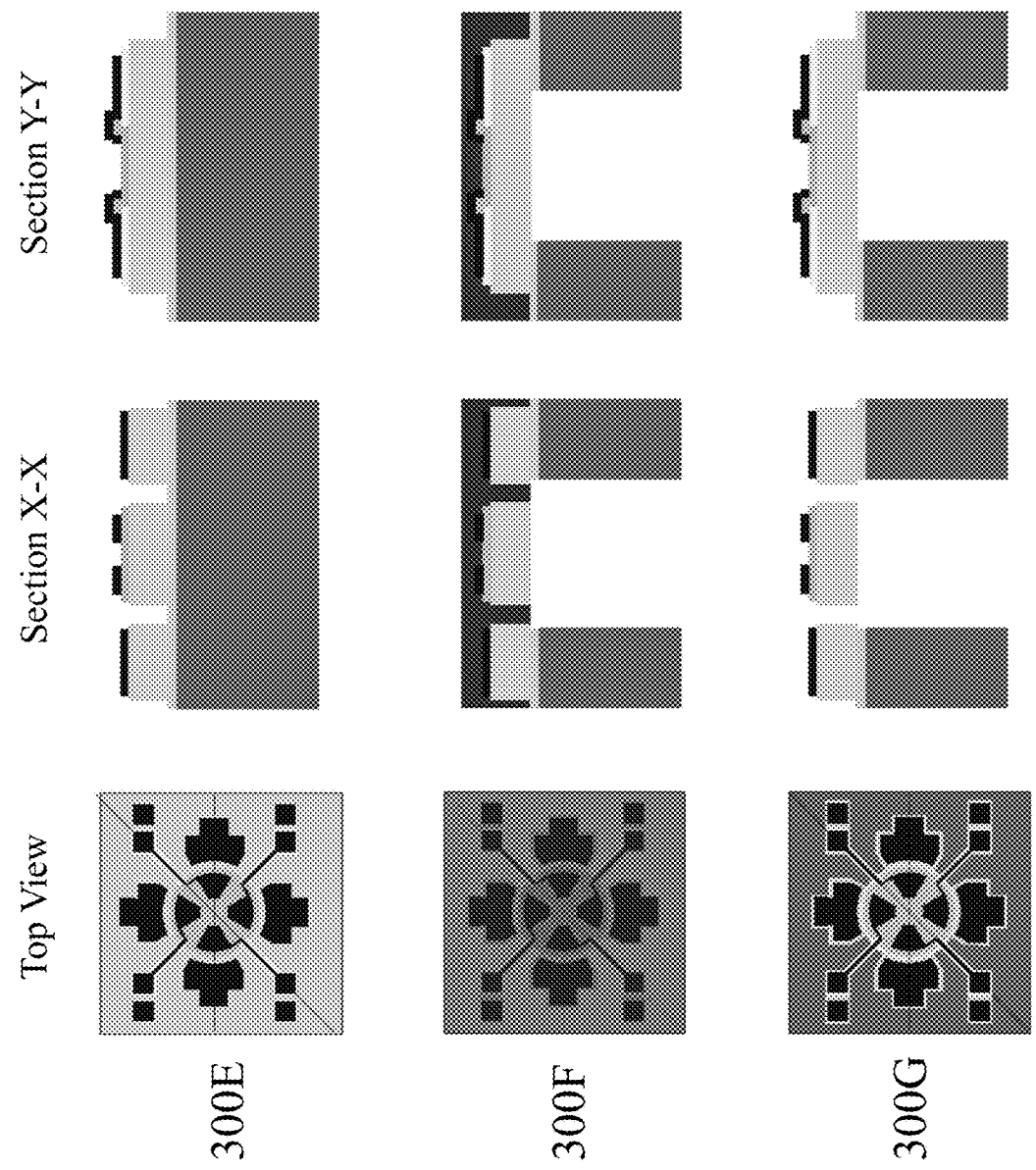

The fabrication process sequence is detailed fully in "PiezoMUMPs Design Handbook Revision 1.3" (MEMSCAP, Durham, N.C., USA, 2014) and is illustrated in FIGS. 3A and 3B respectively for the bulk disk resonators according to embodiments of the invention implemented and tested by the inventors. The process begins at first step 300A with 150 mm n-type double-side polished silicon on insulator (SOI) wafers, as depicted in FIG. 3A. The top silicon surface is doped using phosphosilicate glass (PSG) in order to increase its conductivity. This layer constitutes the main structural layer that will be used to form the device, and that is connected to the electrical ground. A 200 nm-thick thermal silicon dioxide is then grown, patterned and etched using reactive ion etching (RIE), as illustrated in second step 300B in FIG. 3A. This thermal oxide serves to isolate the signal pads and interconnects from the ground plane in the areas without aluminum nitride (e.g., the signal pads or the top of supports). A 0.5 µm thick layer of aluminum nitride is then deposited, patterned, and wet etched, as shown in third step 300C in FIG. 3A. This piezoelectric layer is used for transduction. A metal stack composed of 20 nm of chrome and 1 μm of aluminum is subsequently deposited and patterned through a lift-off process to form the electrical interconnects and pads, as illustrated in fourth step 300D in FIG. 3A.

Figure 4:
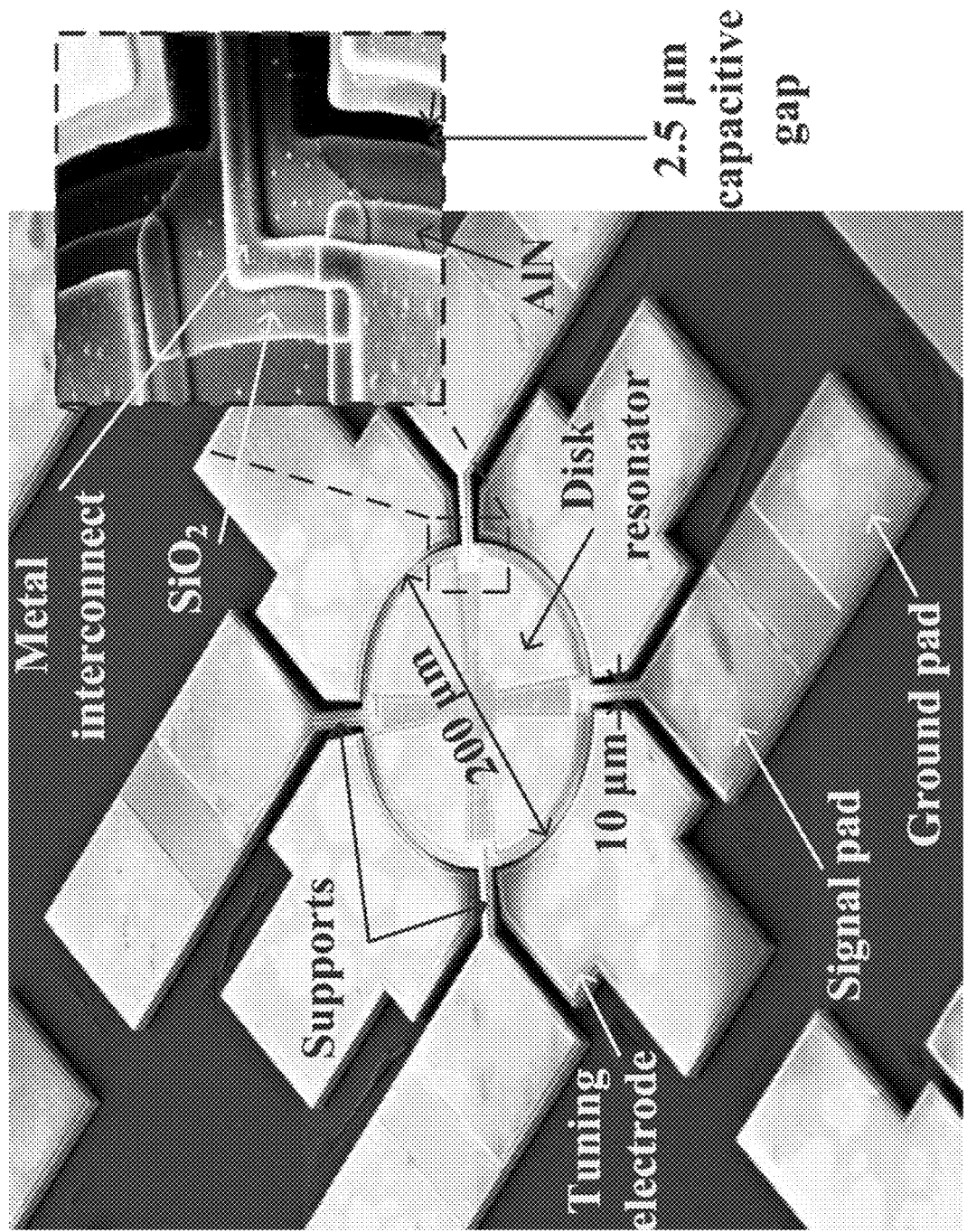
FIG. 4 depicts a SEM micrograph of a disk resonator according to an embodiment of the invention.

At this stage, the silicon is lithographically patterned, and etched using deep reactive ion etching (DRIE) to form the structural disk and the tuning electrodes, as shown in fifth step 300E in FIG. 3B. Afterwards, a protective material is applied to the front side of the substrate, to serve as a cover during subsequent backside etch steps. The substrate layer is then lithographically patterned and etched from the backside using DRIE to form release trenches that stop at the oxide layer. Wet oxide etch then removes the now exposed buried oxide layer in the trench regions, as shown in sixth step 300F in FIG. 3B. The front side protection material is finally stripped by dry plasma etching, which completes the release of the disk structure and allows for its free motion, as illustrated in seventh step 300G in FIG. 3B. FIG. 4 shows an SEM micrograph of one of the fabricated devices together with dimensional data.

E. Measurement Results

E1: Resonance Configurations and Characteristics

Figure 5:
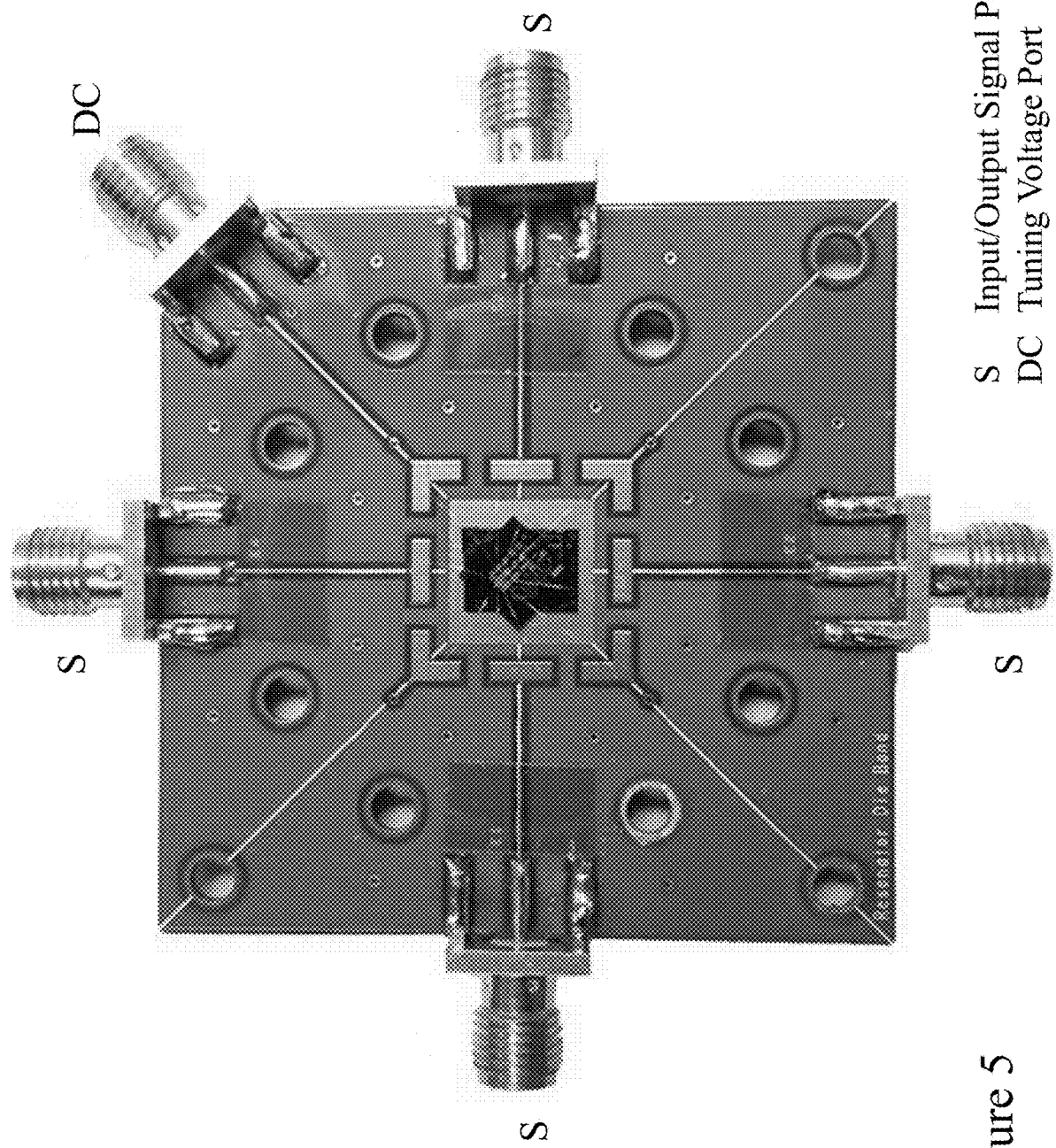
FIG. 5 depicts a printed circuit board employed for testing disk resonators according to embodiments of the invention such as the wire bonded resonator die shown.

The structure was intentionally designed with four independent signal electrodes to enable its use within both single ended and differential configurations, making it possible to directly connect to different amplifier types without the need for extra components or converters such as baluns. The dies of the tested devices were wire bonded directly onto a gold-plated printed circuit board (PCB), as depicted in FIG. 5. The inventors exploited this direct bonding approach in preference to packaging in order to avoid additional parasitics.

Figure 6A:
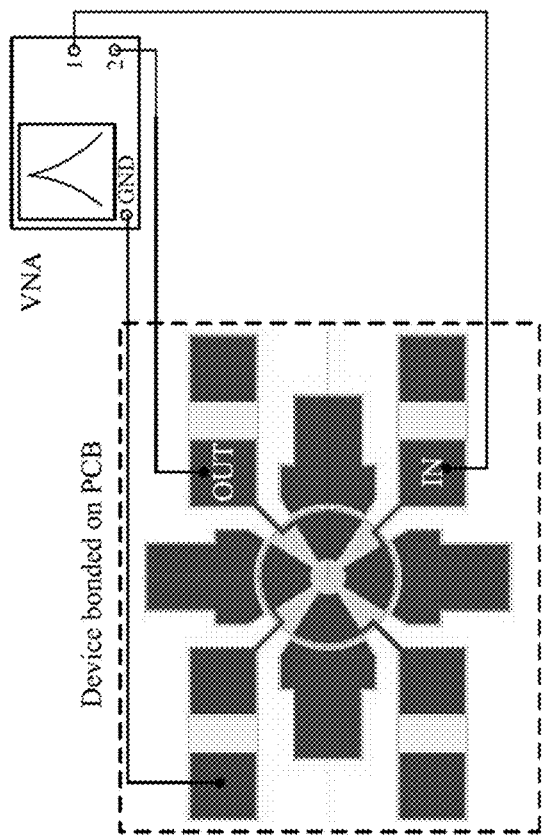
FIGS. 6A and 6B depicts single-ended and differential testing configurations for disk resonators according to embodiments of the invention.
Figure 6B:
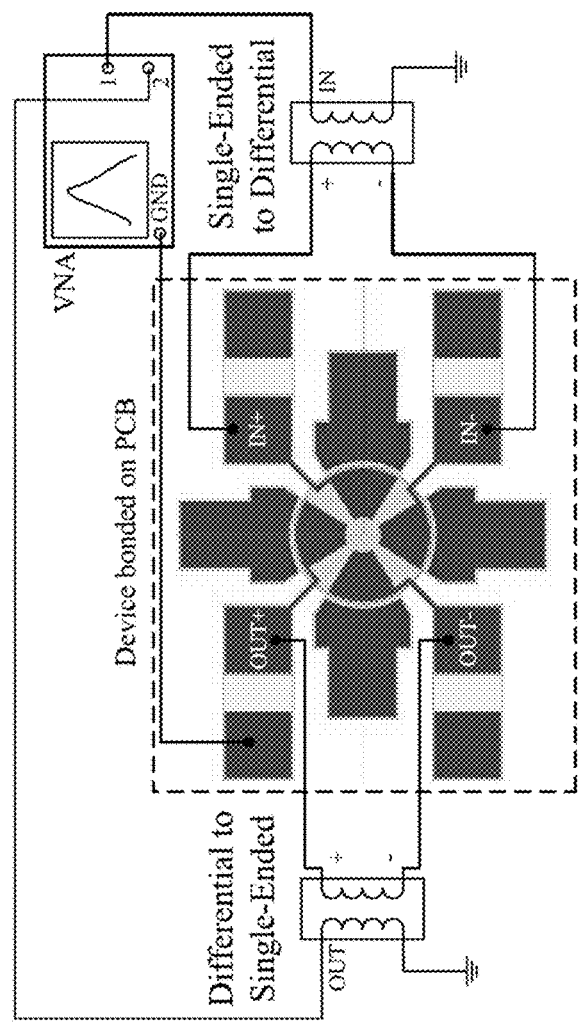
Figure 7A:
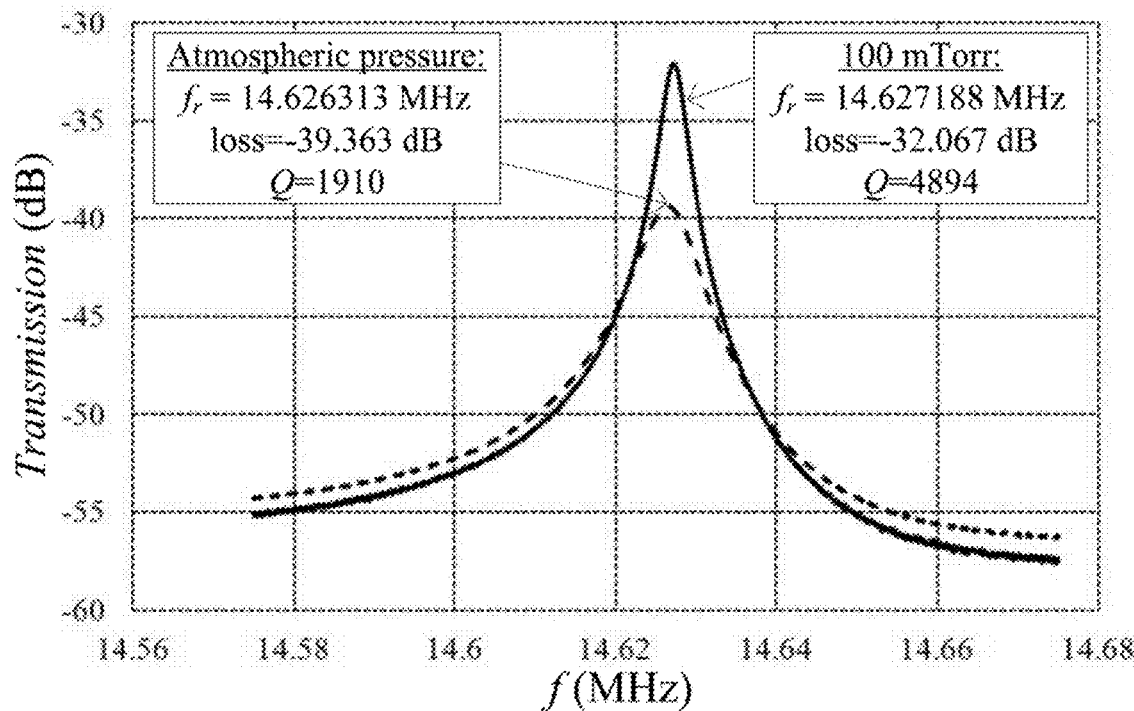
FIGS. 7A and 7B depict measured resonance characteristics of disk resonators according to embodiments of the invention at atmospheric pressure (dashed line) and in vacuum (solid line) for the single-ended and differential configurations respectively.
Figure 7B:
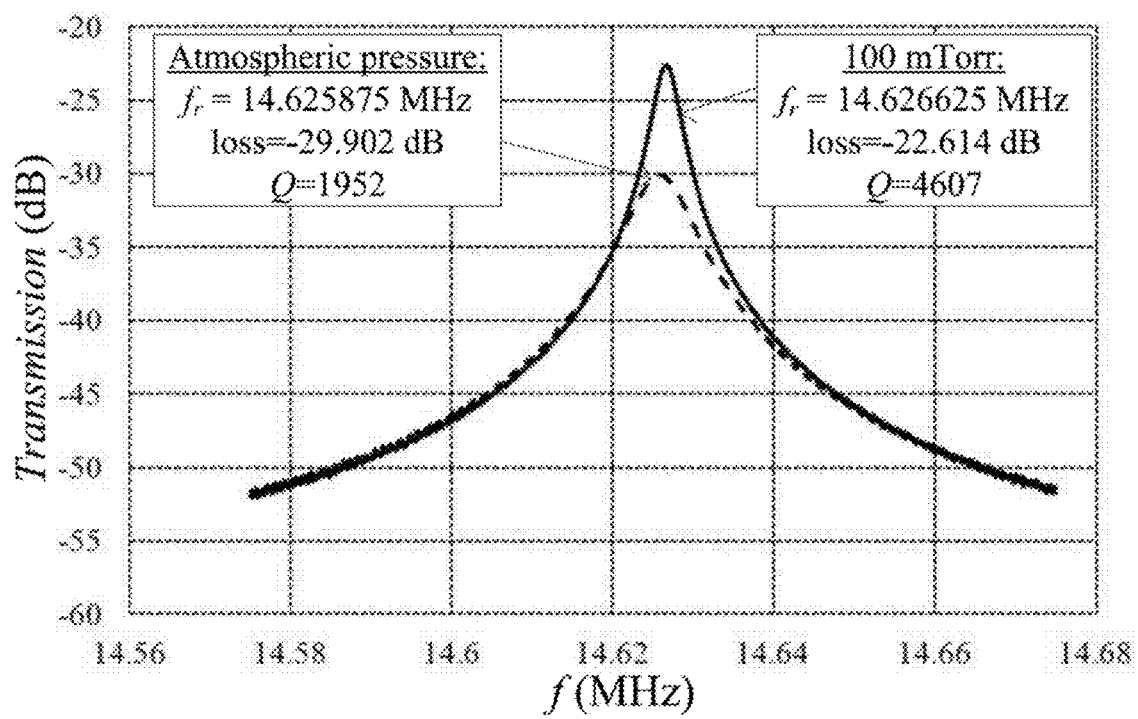

The resonance characteristics of the devices were measured using the test setups depicted in first and second schematics 600A and 600B in FIGS. 6A and 6B respectively for single-ended and differential configurations respectively. These measurements were performed both at atmospheric pressure and in ~100 mTorr vacuum. Measurement results for the devices are shown in FIGS. 7A and 7B respectively at atmospheric pressure (dashed line) and in vacuum (solid line) for the single-ended and differential configurations respectively. The device exhibits a resonance frequency, $f_r$, of 14.63 MHz and quality factor, Q, of approximately 2,000 and approximately 4,900 under atmospheric pressure and 100 mTorr vacuum level, respectively. The quality factor was extracted directly from the 3-dB bandwidth in the device transmission curves. Although modal analysis in simulations projected a resonance frequency of 17.54 MHz, the difference between the simulated and measured values can reasonably be attributed to the residual stress of the different layers, to the discrepancies between the structural material parameters used for simulation and their actual values, and to dimensional variations of the fabricated device.

The resonator exhibits a transmission of −32 dB (i.e., an insertion loss of 32 dB) for the single-ended configuration in a 100 mTorr vacuum level, which corresponds to a motional resistance of ~3.9 kΩ. In the differential configuration, the transmission is higher at −22.6 dB in vacuum, corresponding to a motional resistance of ~1.2 kΩ. This increase in transmission is expected because of the additional drive and sense electrodes used in the differential configuration. It is worth mentioning that simulation predicts an insertion loss of ~12 dB in vacuum (20 dB lower than measurements). The reason for the discrepancy between simulation and measurements can be attributed to the difference between the material piezoelectric coefficients used for simulation and the actual ones.

Figure 8:
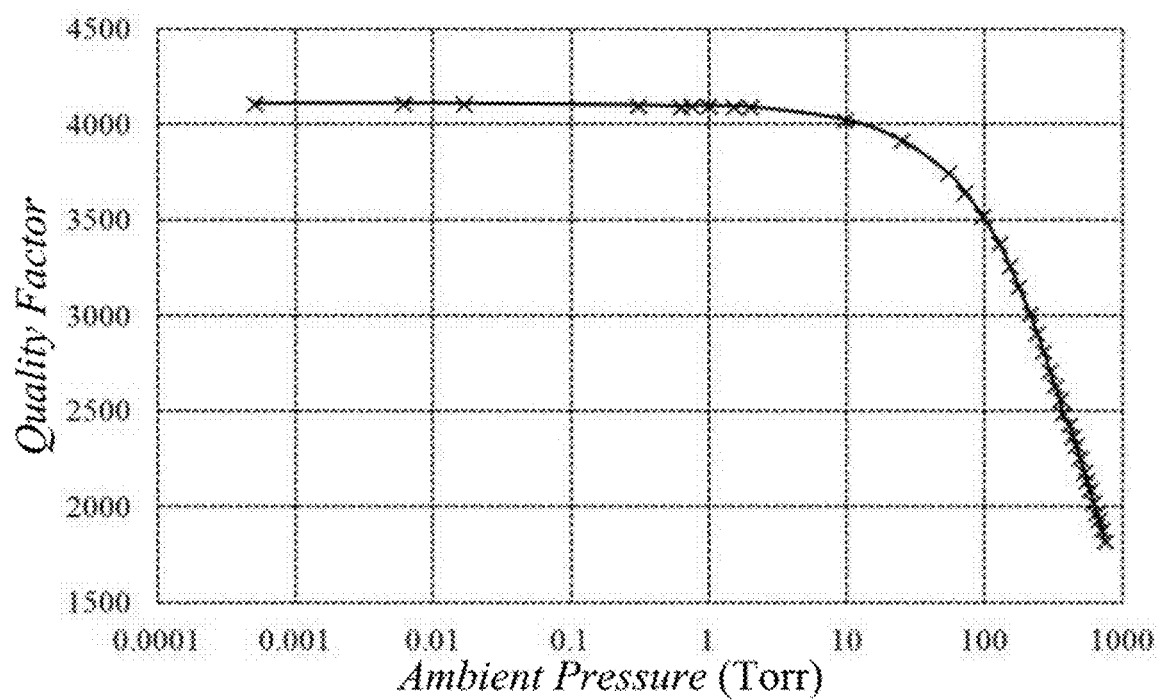
FIG. 8 depicts resonator quality factor versus ambient pressure for disk resonators according to embodiments of the invention.

FIG. 8 illustrates the effect of the ambient pressure level on the resonance quality factor. Air damping has relatively little impact on the device performance, as the quality factor varies only by a factor of ~2.5 over the full range of the studied pressures. The quality factor approaches its maximum at pressures below 5 Torr. Two main effects were considered as potential causes for the limited quality factor measured, since the structural silicon layer is crystalline and its thermoelastic damping should not be a limiting factor. These being firstly thermoelastic damping from the top AlN layer, and secondly anchor loss. AlN damping was ruled out as the cause since two fabricated versions of the devices, one with AlN covering the disk completely, and the other with AlN patterned into four distinct quadrants under the electrodes, exhibit nearly the same quality factor despite the varying AlN disk area coverage.

This remains in-line with the results presented by Hung which confirmed that AlN is a high-Q material. The maximum quality factor is therefore likely limited by anchor loss through the supports. These supports are relatively wide due to fabrication technology constraints (10 μm). However, the design would be capable of reaching higher quality factors if the supports could be made narrower, as noted in Hung, where changing the supports by 1 μm, from 2 μm to 1 μm, led to a quality factor increase of ~80%. Notably, the silicon supports of the proposed device could potentially be narrowed by a post process timed isotropic etch. Xenon difluoride (XeF2) vapor is a promising candidate to perform this etch, as it has already been successfully used to release MEMS structures (e.g. Hung) and is highly selective to silicon.

E2. Effect of Operating Temperature

Figure 9A:
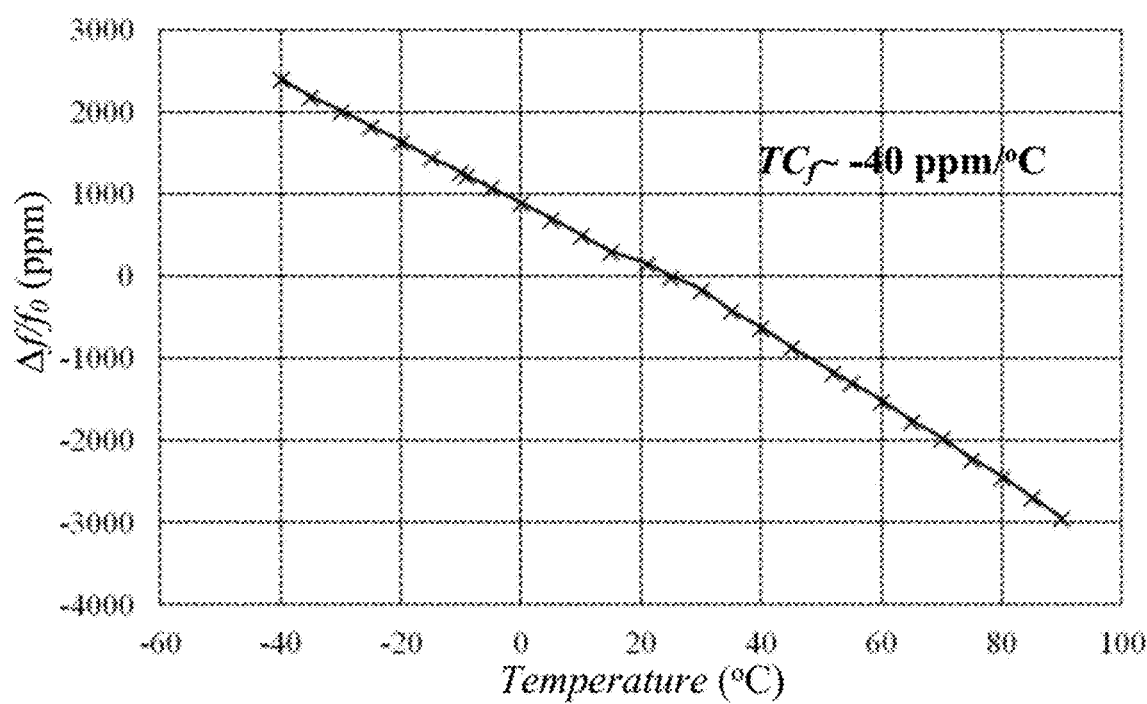

The effect of ambient temperature on the frequency response of the resonator at atmospheric pressure was determined using the single-ended test setup depicted in first schematic 600A in FIG. 6A over the temperature range of −40 to 90° C. The temperature coefficient of frequency ($TC_f$) was found to be approximately −40 ppm/° C., as a consequence mainly of thermal expansion of the structure. The $TC_f$ is slightly higher than devices presented within the prior art, which is probably due to the differences between the properties of the structural materials used. FIGS. 9A to 9C presents the effects of temperature on the resonance frequency, the quality factor, and the transmission respectively of the resonator.

The device's quality factor is limited by two main damping mechanisms, namely, anchor loss due to the supports, and air damping resulting from the squeeze film damping between the resonating disk structure and the electrodes. At low temperatures, the anchor loss is the dominant mechanism, and therefore the quality factor is constant. As the temperature increases, the air damping effect increases due to the increase of the air viscosity, as illustrated in FIG. 9B. Expectedly, the transmission curve follows the same pattern of the quality factor curve as shown in FIG. 9C.

E3: Electrostatic Tuning

Figure 10:
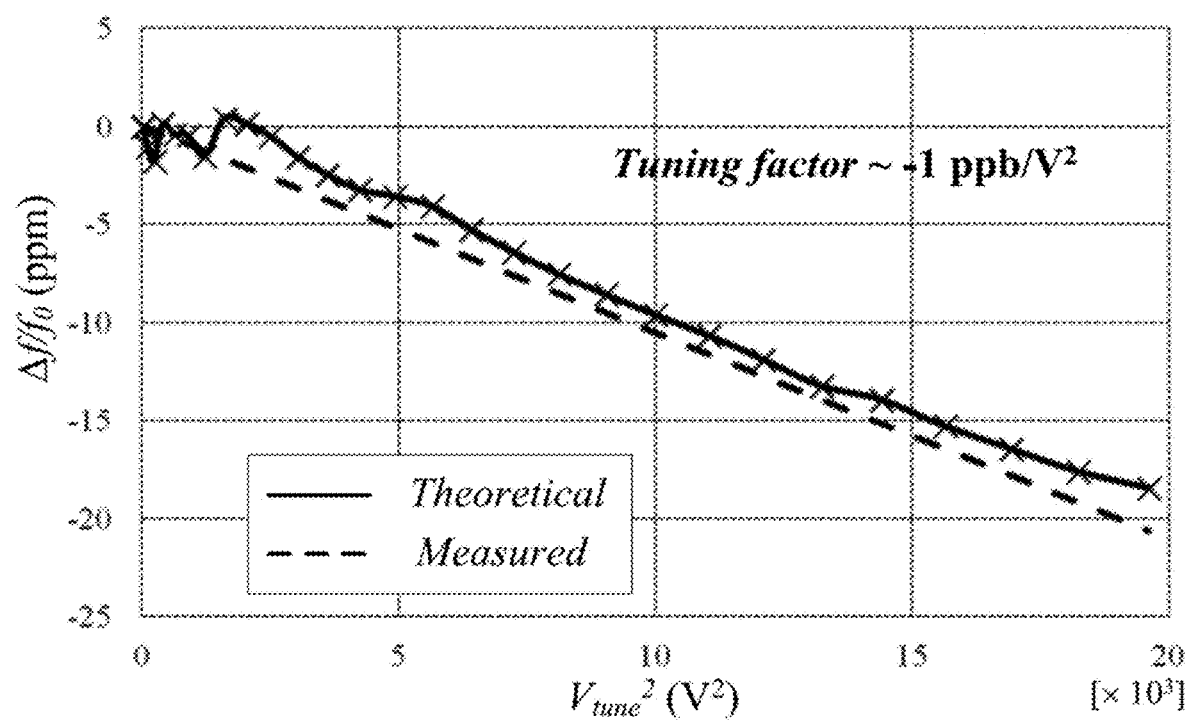
FIG. 10 depicts the fractional change in the resonance frequency of a disk resonator according to an embodiment of the invention versus tuning voltage.

The electrostatic tuning capability of the resonator was characterized using the single-ended test setup of first image 600A in FIG. 6, with an external DC source used to set the tuning voltage. The ground nodes of the source and network analyzer were connected together to ensure a common reference voltage between the ground plane of the disk and the applied tuning voltage, and thus ensure the intended voltage difference between the tuning electrodes and the disk. FIG. 10 presents the measured fractional change in the resonance frequency with respect to the tuning voltage applied, along with the theoretical variation expected based on Equation (8). The device exhibits a tuning factor of approximately −1 ppb/V2 that could serve to compensate for minor variations in operating conditions (e.g., temperature) or for implementing tunable high frequency synthesizers see for example Nabki et al. in "A Highly Integrated 1.8 GHz Frequency Synthesizer based on a MEMS Resonator" (IEEE J. Solid-State Circuits, vol. 44, no. 8, pp. 2154-2168, 2009), where a frequency multiplier could be used to increase the absolute frequency change. Notably, no change in the resonator quality factor was observed throughout the tuning voltage range tested.

F: Observations

Referring to Table 2 the inventors compare the bulk disk resonators according to embodiments of the invention implemented in a low-cost commercial MEMS technology compared to other state-of-the-art bulk-mode resonators. The table highlights its reasonable quality factor, limited by the anchor loss dictated by the technology, and its superior motional resistance. The device achieves the lowest signal loss and motional resistance amongst the bulk-mode devices in comparison. The achieved motional resistance is a key advantage for the device presented in this work, as it results in significant simplification of the associated electronics for realizing complete systems (e.g., oscillator and phase locked loop in Nabki) resulting in lower power consumption and phase noise. The performance demonstrated here is achieved without the need for submicron gaps, as in Hung and Schneider for example, or high DC polarization voltages, as in Elsayed for example. Rather, the resonator device according to embodiments of the invention requires no DC voltage for its operation.

TABLE 2

Comparison Between Bulk Disk Resonators According to Embodiment of the Invention and State-of-the-Art Devices

| Type | Mode | Freq. (MHz) | Q | Trans. (dB) | $R_X$* (Ω) | $V_{DC}$ (V) | Freq. Tuning | Note |
|---|---|---|---|---|---|---|---|---|
| Piezo. | Thin-Film Bulk Acoustic | 1500 1800 | 350 54 | >−5 | ~50 | — | No | 1 |
| Piezo. | Contour | 271 | 2100 | — | 188 | — | No | 2 |
| Piezo. | Contour | 968 | 1805 | — | 56 | — | Yes | 3 |
| Piezo. | Contour | 181 386 | 706 172 | — | 250 3k | — | No | 4 |
| Piezo. | Lateral | 527.4 | 1780 | — | 110 | — | No | 5 |
| 1 μm Wide Supports | | | | | | | | |
| Cap./Piezo. | Wine-Glass | 300 | 12,748 | −34 | 4.9k | — | No | 6 |
| 2 μm Wide Supports | | | | | | | | |
| | | 300 | 7,076 | −40 | 9.9k | | | |
| 250 nm gap and 1.2 μm anchor | | | | | | | | |
| Cap./Piezo. | Radial | 51 | 8,800 (vacuum) | −40 | 9.9k | — | No | 7 |
| 120 nm gap and 1.8 μm anchor | | | | | | | | |
| | | 51 | 6,600 (vacuum) | −30 | 3.01k | | | |
| Cap. | 1ary Elliptic | 2.9 | 66,000 | −53 | 44.6k | 10 | Yes | 8 |
| | 2ary Elliptic | 5.9 | 100,000 | −31 | 3.4k | | | |
| Cap. | Wine-Glass | 210 1520 | 7,700 (1 mTorr) 3,000 (1 mTorr) | — | 9.16k 791.6k | 15 5 | Yes | 9 |
| Cap. | Lamé | 6.35 | 1.6M (36 μTorr) 5,100 (atm.) | −40 | 9.9k | 50 | Yes | 10 |
| Cap. | Wine-Glass | 5.43 | 1.9M (10 mTorr) 10,000 (atm.) | −45 | 17k | 60 | Yes | 11 |
| Cap. | 2ary Elliptic | 8.14 | — | — | — | 25 | Yes | 12 |
| Cap. | 2ary Elliptic | 1.5 | 33,000 (10 mTorr) | | | 50 | Yes | 13 |

TABLE 2-continued

Comparison Between Bulk Disk Resonators According to Embodiment of the Invention and State-of-the-Art Devices

| Type | Mode | Freq. (MHz) | Q | Trans. (dB) | $R_X^*$ ($\Omega$) | $V_{DC}$ (V) | Freq. Tuning | Note |
|---|---|---|---|---|---|---|---|---|
| 10 µm Wide Supports ||||||||| 
| Piezo. | Wine-Glass | 14.63 | 4,894** (≤mTorr) 1,952 (atm.) | −22 | 1.2k | — | Yes | 14 |

Note 1:
Zinc oxide (ZnO) and lead-zirconium-titanate (PZT) FBARs
Note 2:
AlN contour mode resonators
Note 3:
AlN resonators with integrated heaters for temperature controlled operation
Note 4:
Reconfigurable AlN resonator based on integrated switches
Note 5:
Lithium niobate (LiNbO$_3$) piezoelectric resonators
Note 6:
AlN disk resonators with capacitive-piezoelectric actuation - sensing electrodes above/below the structure with 260 nm gap and anchor beams 1-2 µm wide.
Note 7:
AlN capacitive-piezoelectric disk resonators with ON/OFF switching capability utilizing capacitive electrodes above/below the structure with 120-250 nm gap and center anchors.
Note 8:
Bulk mode disk gyroscopes in <111> and <100> single crystalline Si with 180-250 nm capacitive gaps.
Note 9:
Poly-Si wine-glass mode ring resonators with 63-85 nm capacitive gaps and 1.6 µm wide anchor beams.
Note 10:
Square Lamé-mode capacitive resonator with Si structural layer with 2 µm transduction gap.
Note 11:
Capacitive disk resonator with Si structural layer with 2 µm transduction gap.
Note 12:
Dodecagon disk gyro with Si structural layer.
Note 13:
Dodecagon disk gyro with combs utilizing a Si structural layer.
Note 14:
Si wine-glass disk resonators using piezoelectric actuation/sensing, electrostatic frequency tuning, and anchor beams of 10 µm width.

The Q-factor of bulk disk resonators according to embodiments of the invention can be further improved by decreasing the width of the suspension beams to reduce anchor loss, either by post-processing as described supra, or by using another technology with smaller critical dimensions. Compared to other piezoelectric disk resonators (e.g., Hung and Schneider for example), the proposed design adds tuning functionality to piezoelectric resonators by employing separate electrostatic electrodes. Although the tuning range of the proposed design is relatively low due to the large gap imposed by the fabrication technology selected, it could be significantly improved by using a technology with narrower lateral gaps.

Beneficially the bulk disk resonator according to embodiments of the invention also allows for various frequency devices to be fabricated concurrently, unlike FBARs. Further, bulk disk resonator according to embodiments of the invention are achieved in a relatively simple commercial MEMS technology, and their performance could be enhanced by implementation in a technology with smaller critical dimensions.

Whilst embodiments of the invention have been described and depicted with respect to circular disk resonators operating in the wine-glass mode the inventive concepts of transverse piezoelectric actuation and electrostatic tuning are not limited to these resonators but may be applied to other resonator designs including, but not limited to, square Lame mode resonators.

Within the embodiments of the invention described and depicted supra the bulk disk resonator exploits a silicon disk which is electrically conductive for the ground electrode, an aluminum nitride piezoelectric layer, and an upper metallization to provide drive (input signal) and read (output signal) electrodes. However, it would be evident that within other embodiments of the invention the central disk may be electrically insulating and that the upper and lower electrodes are both formed by metal layers on both sides of the piezoelectric layer and that these are connected to pads upon the substrate.

Optionally, the central disk may be formed from a ceramic other than silicon wherein the ceramic may be selected from the group comprising silicon dioxide ($SiO_2$), silicon nitride ($Si_3N_4$), silicon oxynitride ($SiO_xN_y$), carbon (C), aluminum oxide ($Al_2O_3$) and SiC It would be evident to one of skill in the art that the MEMS may be formed before or after fabrication of integral CMOS electronics. MEMS processing post-CMOS may limit the upper temperature of these processing steps to a maximum temperature of below, for example 25° C., 50° C., 100° C., 200° C., 250° C., 300° C., and 350° C.

Optionally, embodiments of the invention may exploit a thin silicon or ceramic disk with underside metallization that wraps around to electrical tracing upon the upper surface of the disk.

Optionally, the piezoelectric may be selected in dependence upon the processing flow and processing capabilities of the MEMS process employed to form the MEMS bulk disk resonator. However, the piezoelectric material may be selected from the group comprising, but not limited to, quartz, berlinite ($AlPO_4$), lead titanate ($PbTiO_3$), lithium niobate ($LiNbO_3$), lithium tantalate $LiTaO_3$, barium titanate $BaTiO_3$, lead zirconium titanate (PZT) ($Pb(Zr_xTi_{1-x})O_3$), potassium niobate (KNbO$_3$), zinc oxide (ZnO), indium nitride (InN), gallium nitride (GaN), aluminum nitride (AlN), zinc blend crystal structure III-V semiconductors, zinc blend crystal structure II-VI semiconductors, wurtzite III-V semiconductors, wurtzite II-VI semiconductors, polyvinylidene fluoride (PVDF), and organic nanostructures such as self-assembled diphenylalanine peptide nanotubes (PNTs) for example.

The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A microelectromechanical systems (MEMS) resonator comprising:
    a central disk capable of vibrating in a "wine-glass" mode;
    a layer formed across predetermined regions of the central disk formed from a piezoelectric material;
    a metallization layer formed upon the layer; and
    a plurality of N supports, each support coupled between the central disk and layer at one end and a substrate upon which the MEMS resonator is disposed; wherein
    the MEMS resonator exhibits bulk mode resonance with transverse piezoelectric actuation of the layer;
    the metallization layer upon a top surface of the central disk is divide into N segments of predetermined dimensions around a periphery of the central disk, each segment is disposed between a pair of the plurality of N supports and is capacitively coupled to a tuning electrode disposed adjacent that portion of the central disk and separated by a predetermined gap;
    each metallization layer segment is electrically coupled to a predetermined electrode of a plurality of electrodes upon the substrate via electrical traces upon the plurality of supports;
    the central disk is electrically connected to ground via the central disk and the plurality of N supports;
    a first predetermined subset of the plurality of electrodes are input signal pads; and
    a second predetermined subset of the plurality of electrodes are output signal pads.

2. The MEMS resonator according to claim 1, wherein the MEMS resonator does not require a DC voltage to operate.

3. The MEMS resonator according to claim 1, wherein the layer is at least one of continuous across a surface of the central disk and patterned into a predetermined pattern.

4. The MEMS resonator according to claim 1, wherein the N segments of predetermined dimensions are at predetermined locations upon the central disk, wherein the predetermined dimensions and predetermined locations are established in dependence upon a strain distribution within the central disk.

5. A resonator array comprising:
    a substrate; and
    a plurality of microelectromechanical systems (MEMS) resonators formed upon the substrate; wherein
    each MEMS resonator comprises:
        a central disk capable of vibrating in a "wine-glass" mode;
        a layer formed across predetermined regions of the central disk formed from a piezoelectric material;
        a metallization layer formed upon the layer; and
        a plurality of N supports, each support coupled between the central disk and layer at one end and the substrate upon which the MEMS resonator is disposed; wherein
    each MEMS resonator exhibits bulk mode resonance with transverse piezoelectric actuation of the layer; and
    said each MEMS resonator exhibits its bulk mode resonance at a different predetermined resonant frequency;
    the metallization layer is divided into N segments of predetermined dimensions around a periphery of the central disk, each segment is disposed between a pair of the plurality of N supports and is capacitively coupled to a tuning electrode disposed adjacent that portion of the central disk and separated by a predetermined gap;
    each metallization layer segment is electrically coupled to a predetermined electrode of a plurality of electrodes upon the substrate via electrical traces upon the plurality of supports;
    the central disk is electrically connected to ground via the central disk and the plurality of N supports;
    a first predetermined subset of the plurality of electrodes are input signal pads; and
    a second predetermined subset of the plurality of electrodes are output signal pads.

6. The MEMS resonator array according to claim 5, wherein
    the MEMS resonator does not require a DC voltage to operate.

7. The MEMS resonator array according to claim 5, wherein
    the layer is at least one of continuous across a surface of the central disk and patterned into a predetermined pattern.

8. The MEMS resonator array according to claim 5, wherein
    the N segments of predetermined dimensions are at predetermined locations upon the central disk, wherein
    the predetermined dimensions and predetermined locations are established in dependence upon a strain distribution within the central disk.

9. A microelectromechanical systems (MEMS) resonator comprising:
    a central disk;
    a layer formed across predetermined regions of the central disk formed from a piezoelectric material;
    a metallization layer formed upon the layer; and a plurality of N supports, each support coupled between the central disk and layer at one end and a substrate upon which the MEMS resonator is disposed; wherein the resonator exhibits bulk mode resonance with transverse piezoelectric actuation of the layer;

the metallization layer upon the top surface of the central disk is divide into N segments of predetermined dimensions around the periphery of the disk, each segment is disposed between a pair of the plurality of N supports and is capacitively coupled to a tuning electrode disposed adjacent that portion of the central disk and separated by a predetermined gap;

each metallization layer segment is electrically coupled to a predetermined electrode of a plurality of electrodes upon the substrate via electrical traces upon the plurality of supports;

the central disk is electrically connected to ground via the central disk and the plurality of N supports;

a first predetermined subset of the plurality of electrodes are input signal pads; and a second predetermined subset of the plurality of electrodes are output signal pads.

* * * * *